United States Patent
Prasad et al.

(10) Patent No.: US 10,515,802 B2
(45) Date of Patent: Dec. 24, 2019

(54) TECHNIQUES FOR FORMING LOW STRESS MASK USING IMPLANTATION

(71) Applicant: Varian Semiconductor Equipment Associates, Inc., Gloucester, MA (US)

(72) Inventors: Rajesh Prasad, Lexington, MA (US); Tzu-Yu Liu, Somerville, MA (US); Edwin Arevalo, Gloucester, MA (US); Deven Mittal, Gloucester, MA (US); Somchintana Norasetthekul, Gloucester, MA (US); Kyuha Shim, Andover, MA (US); Lauren Liaw, Gloucester, MA (US); Takaski Shimizu, Gloucester, MA (US); Nobuyuki Sasaki, Cupertino, CA (US); Ryuichi Muira, Gloucester, MA (US); Hiro Ito, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 16/030,311

(22) Filed: Jul. 9, 2018

(65) Prior Publication Data
US 2019/0326116 A1 Oct. 24, 2019

Related U.S. Application Data

(60) Provisional application No. 62/660,571, filed on Apr. 20, 2018.

(51) Int. Cl.
*H01L 21/033* (2006.01)
*H01L 21/265* (2006.01)
*H01L 21/02* (2006.01)

(52) U.S. Cl.
CPC ...... *H01L 21/0337* (2013.01); *H01L 21/0217* (2013.01); *H01L 21/02266* (2013.01); *H01L 21/02321* (2013.01); *H01L 21/26593* (2013.01)

(58) Field of Classification Search
CPC ......... H01L 21/26593; H01L 21/02266; H01L 21/02321; H01L 21/31155; H01L 21/0337
See application file for complete search history.

(56) References Cited

U.S. PATENT DOCUMENTS

| | | | | |
|---|---|---|---|---|
| 2006/0244074 A1* | 11/2006 | Chen | ............... | H01L 21/823807 257/371 |
| 2014/0256137 A1 | 9/2014 | Richter et al. | | |
| 2014/0273461 A1* | 9/2014 | Lee | .......... | C23C 16/26 438/694 |
| 2015/0194317 A1 | 7/2015 | Manna et al. | | |
| 2016/0079034 A1* | 3/2016 | Yieh | ................. | H01L 21/26506 427/526 |
| 2018/0209035 A1* | 7/2018 | Liu | ................... | H01J 37/32412 |

FOREIGN PATENT DOCUMENTS

JP 05275702 10/1993
KR 20050067451 A 7/2005

OTHER PUBLICATIONS

International Search Report and Written Opinion dated Oct. 25, 2019 for PCT/US2019/024878 filed Mar. 29, 2019.

* cited by examiner

*Primary Examiner* — Daniel Luke

(57) ABSTRACT

A method may include depositing a mask layer on a substrate using physical vapor deposition, wherein an absolute value of a stress in the mask layer has a first value; and directing a dose of ions into the mask layer, wherein the absolute value of the stress in the mask layer has a second value, less than the first value, after the directing the dose.

17 Claims, 8 Drawing Sheets

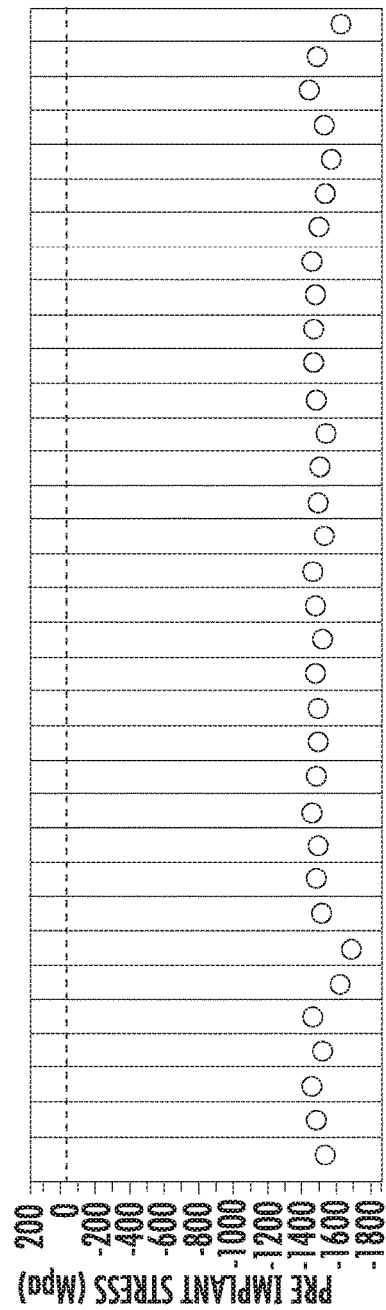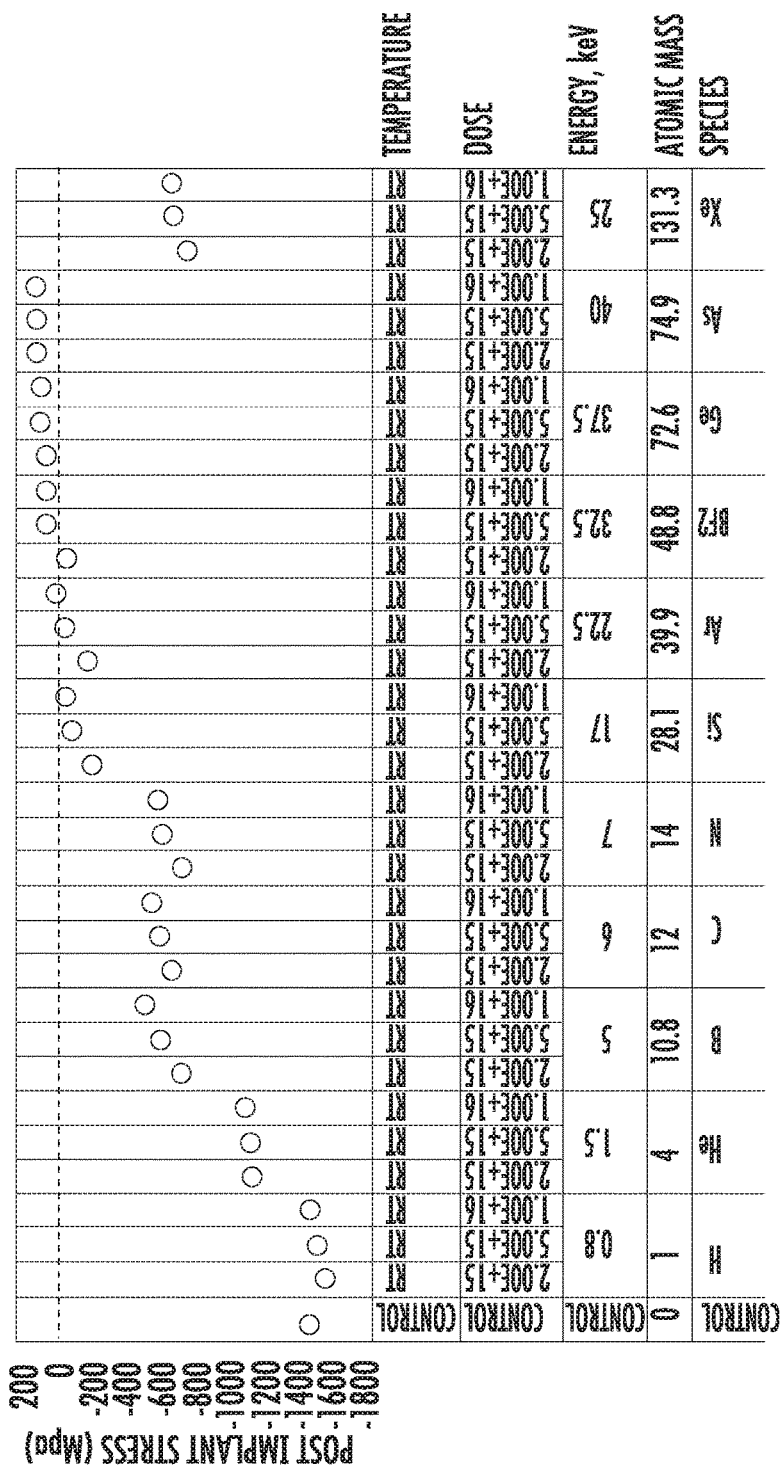
FIG. 2A
FIG. 2B

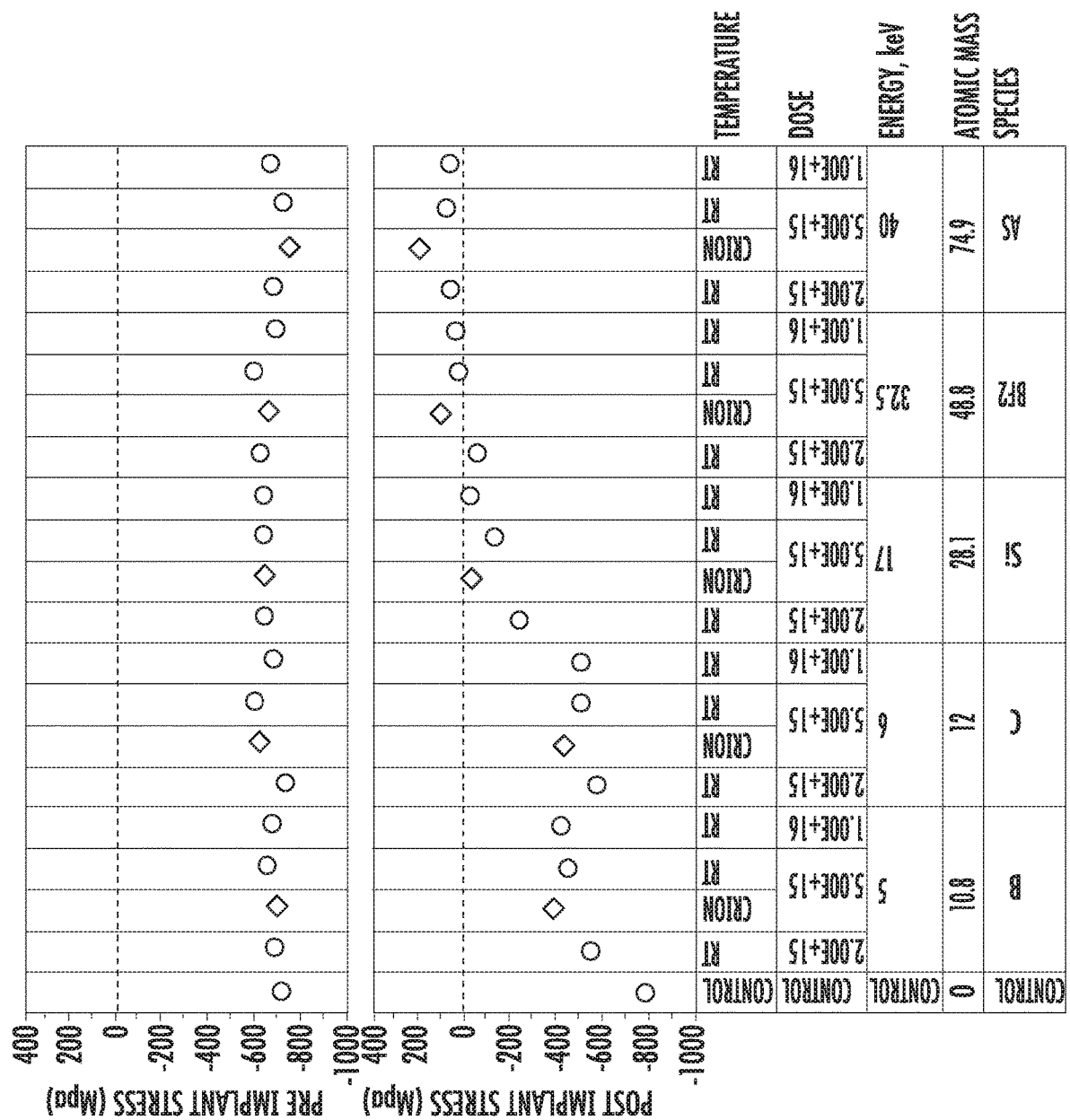

TECHNIQUES FOR FORMING LOW STRESS MASK USING IMPLANTATION

RELATED APPLICATIONS

This application claims priority to U.S. Provisional patent application 62/660,571, entitled TECHNIQUES FOR FORMING LOW STRESS MASK USING IMPLANTATION, filed Apr. 20, 2018, and incorporated by reference herein in its entirety.

FIELD

The present embodiments relate to device processing, and more particularly, to etch resistant sacrificial masks having improved stability.

BACKGROUND

In the present day, device fabrication, such as semiconductor device fabrication, may the use of one or multiple sacrificial mask layers, or sacrificial masks, including so-called hard masks. During patterning of devices using hardmasks, such as during three dimensional NAND memory device (3D NAND) and DRAM fabrication, a useful property of the hardmask is etch resistance to the etchant being used to etch underlying substrate features.

Patterning of narrow features (DRAM bitline/wordline patterning) or hard-to-etch materials e.g refractory metals or chalcogenide compounds requires maintaining vertical profiles, including minimal line bending and minimal line edge roughness, during lithography and post-lithography etching of underlying features. In addition, metallic or doped hardmask films may be disfavored, due to possible contamination in a device being patterned, such as a memory device. Known hardmask materials may have density on the order 1.8 g/cm$^3$ to ~2.4 g/cm$^3$ for materials such as chemical vapor deposition (CVD) of C, physical vapor deposition (PVD) of C, and SiN formed by plasma enhanced chemical vapor deposition (PECVD). These hardmask materials may exhibit insufficient etch selectivity for present day and future technology nodes. As a consequence, a thicker hardmask layer may be needed, impacting critical dimension (CD) control, leading to the inability to pattern small CD features, and the inability to etch material in high aspect ratio structures. Alternatively, physical vapor deposition (PVD) may be used to generate hardmask materials having higher etch resistance, where the etch rate during patterning processes is acceptably low. A characteristic of known hardmask materials exhibiting acceptable etch resistivity, such as PVD hard mask layers, is a relatively high stress. Two results of such high stress in a layer, such as a hardmask layer, is wafer (substrate) bowing, where the bowing may lead to overlay shifts and line bending of patterned features With respect to the CVD process, the PVD process provides excellent film purity because of the avoidance of byproduct formation and the film formation by direct transport of atoms from the Si target source to the substrate through the gas phase. SiN material deposited by PVD has a higher density of 2.9 g/cc vs ~2.4 g/cc(cm$^3$) for SiN material formed by CVD, and is close to the bulk density of 3.1 g/cc. The PVD SiN deposition temperature is generally lower in the range 200° C. to 375° C., and no hydrogen is present in SiN films deposited by PVD. For a highly compressive film, the film structure is amorphous, while low stress films exhibit a columnar structure.

With respect to these and other considerations the present disclosure is provided.

BRIEF SUMMARY

In one embodiment, a method may include depositing a mask layer on a substrate using physical vapor deposition, wherein an absolute value of a stress in the mask layer has a first value. The method may further include directing a dose of ions into the mask layer, wherein the absolute value of the stress in the mask layer has a second value, less than the first value, after the directing the dose.

In another embodiment, a method for fabricating a low stress layer may include depositing a mask layer, comprising SiN, on a substrate using physical vapor deposition, wherein an absolute value of a stress in the mask layer has a first value. The method may include cooling the substrate to an implantation temperature, the implantation temperature being below room temperature. The method may further include directing a dose of ions into the mask layer when the substrate is at the implantation temperature, wherein the absolute value of the stress in the mask layer has a second value, less than the first value, after the directing the dose.

In another embodiment, a method for fabricating a low stress layer may include depositing a SiN layer on a substrate using physical vapor deposition, wherein an absolute value of a stress in the SiN layer has a first stress value, and wherein the SiN layer exhibits a first density. The method may also include directing a dose of ions into the mask layer, wherein the absolute value of the stress in the mask layer has a second value, less than the first value, and wherein the SiN layer exhibits a second density, at least 90% of the first density, after the directing the dose.

BRIEF DESCRIPTION OF THE DRAWINGS

FIG. 2A presents a graph depicting as-deposited stress for a series of SiN layer samples deposited under conditions of high stress;

FIG. 2B presents stress data for the samples of FIG. 2A after exposure to various ions, according to embodiments of the disclosure;

FIG. 4A presents a graph depicting as-deposited stress for a series of SiN layer samples deposited under conditions of medium stress;

FIG. 4B presents stress data for the samples of FIG. 4A after exposure to various ions at cold implant temperatures, according to embodiments of the disclosure

Figure 1A:
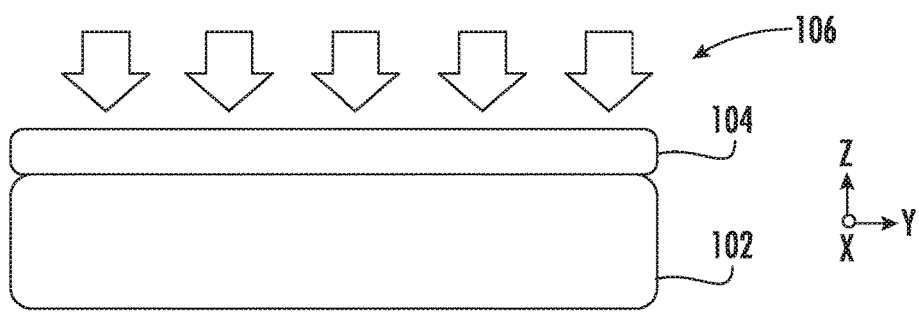
FIGS. 1A-1C show exemplary stages of formation of a low stress PVD hardmask layer, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

In accordance with some embodiments, novel processing techniques entail implantation of hardmask layers using low mass species. In various embodiments, the hardmask layers are formed using a physical vapor deposition (PVD) process, and in particular embodiments the PVD process involves sputtering of a target to deposit a PVD layer. In one example, a PVD SiN film may be deposited by reactive pulsed DC sputtering using high purity single crystal Si and nitrogen gas.

Figure 1B:
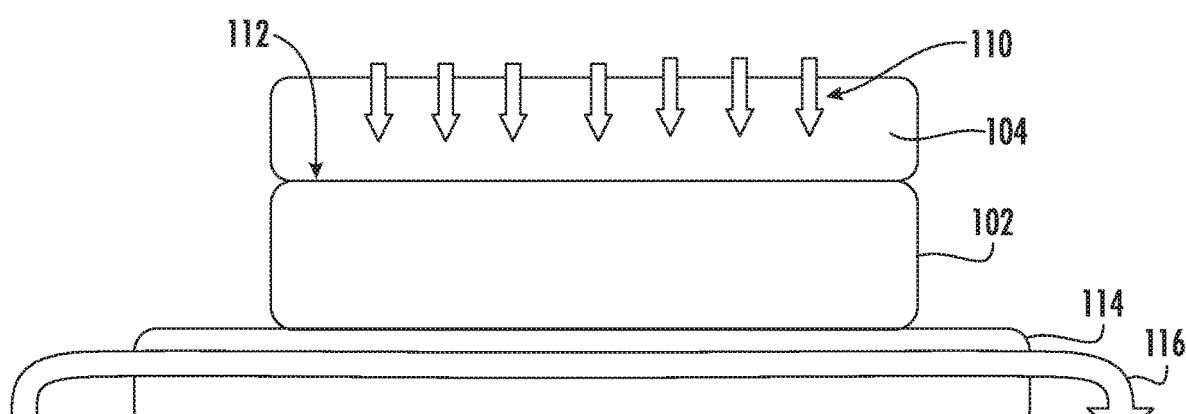
Figure 1C:
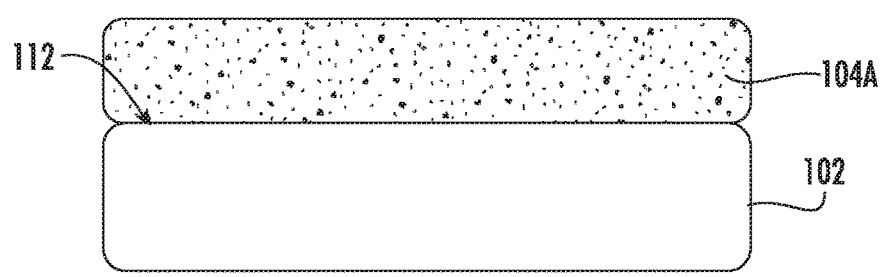

FIG. 1A-1C depict various stages in formation of a low stress layer, according to embodiments of the disclosure. In FIG. 1A, the operation of depositing a layer is shown. The layer is referred to as hardmask layer 104, and is deposited on a substrate 102, where the substrate 102 may represent any suitable substrate, including an unpatterned substrate or a substrate patterned with multiple components and multiple layers. Notably, the hardmask layer 104 may be used as a sacrificial layer during device processing to form devices or other structures in or on the substrate 102. The hardmask layer 104 may be formed by condensing PVD species 106. The PVD species 106 may represent any suitable PVD species including sputtered species formed by plasma-based sputtering or ion beam sputtering. Alternatively, the PVD species 106 may be formed by ion assisted deposition or other hybrid technique. The embodiments are not limited in this context. The thickness of the hardmask layer 104 may be chosen for suitability to a particular application. In some examples, the thickness of the hardmask layer 104 (along the Z-axis of the Cartesian coordinate system shown) may be between 50 nm and 200 nm. Exemplary materials for the hardmask layer include silicon nitride (SiN), carbon, and silicon oxide. The embodiments are not limited in this context.

Turning to FIG. 1B there is shown a subsequent operation after the hardmask layer 106 has been fully deposited. In this operation, a dose of ions is directed into the hardmask layer 106, as represented by the species 110. According to various embodiments, the hardmask layer may be a SiN material, while the species 110 may have a suitable mass, such as an atomic weight of 20 amu or greater. According to some embodiments, the species 110 may be ions, where the mass/charge ratio exceeds 10. For example, a singly ionized silicon ion ($Si^+$) has a mass/charge ratio of 28. In some embodiments the species 110 may be B ions, C ions, N ions, Si ions, Ar ions, $BF_2$ ions, Ge ions, As ions, or Xe ions. In other embodiments, the species 110 may be ions having a mass in the range of 10-20 amu, including boron, carbon, nitrogen, oxygen, fluorine, or neon. The embodiments are not limited in this context.

In various embodiments, the directing of species 110 into the hardmask layer 104 involves using a beamline ion implanter. In other embodiments, the species 110 may be provided in a plasma-based implant tool, such as a plasma doping (PLAD) tool. The PLAD tool may use $N_2$ gas with a mass/charge ratio of 28, a similar mass/charge ratio to singly ionized Si, achieved with a beamline ion implanter. The PLAD tool can easily achieve higher doses than a beamline implanter of the order $5e16/cm^2$ to $2e17/cm^2$ which dose level may enable conversion of the SiN film from compressive to tensile stress. Alternatively, the PLAD tool may achieve neutral stress with a higher implant throughput than a beamline implanter. PLAD $N_2$ may be used in lieu of beamline Ar or PLAD Ar, where Ar may cause sputtering of the PVD SiN film. The embodiments are not limited in this context. In some embodiments using a beamline ion implanter the ion dose for species 110 may be $1E16/cm^2$ or less. In other embodiments using a PLAD tool, the ion dose for species 110 may be $2E17/cm^2$ or less. The embodiments are not limited in this context.

As further shown in FIG. 1B, the species 110 are directed into the hardmask layer 104 when the substrate 102 is disposed on a platen 114. The platen 114 may be cooled by a coolant 116, where the coolant 116 circulates through the platen or through a stage (not separately shown) thermally coupled to the platen 114. In various embodiments, the coolant 116 may act to establish a substrate temperature of substrate 102 of room temperature (~30° C.) or below. In some embodiments, the substrate temperature of substrate 102 may be less than zero degrees Celsius (° C.), and in particular embodiments may be −100° C. The embodiments are not limited in this context.

As detailed below, the implanting of the species 110 at room temperature or below may reduce the stress of the hardmask layer 104. For example, as deposited, the hardmask layer 104 may exhibit compressive stress, while a first value of stress of the hardmask layer 104 before exposure to the species 110 between 200 MPa compressive stress and 3 GPa compressive stress. In some embodiments, the second value of stress for hardmask layer 104 after exposure to species 110 may be adjusted by adjusting ion species, ion dose, and ion energy, among other factors. The second value of stress may range between 200 MPa compressive stress to 200 MPa tensile stress, according to some non-limiting embodiments.

For example, in accordance with various embodiments, the stress of the hardmask layer 104 may have a first value of 0.5 GPA or greater compressive stress upon completion of deposition of hardmask layer 104. Such a level of stress may be unsuitable for applications where the hardmask layer 104 is to be used for patterning of the substrate 102. As noted, one hallmark of many PVD layers, meaning layers formed by a PVD process, is the relatively higher density of such layers. In the case of carbon-based PVD layers, the relatively higher density of the PVD carbon layers has been associated with the relatively high stress levels often found in the PVD layers, such as SiN layers. The present embodiments address this issue by providing implantation procedures suitable for generating lower stress levels in PVD layers. In particular examples where the first stress value of a PVD layer is relatively high, such as 0.2 GPa compressive or greater, the present inventors have discovered approaches to reduce stress to a lower value of compressive stress, zero stress, or a small value of tensile stress. These approaches result in a low-stress layer, as represented by the layer 104A in FIG. 1C.

Figure 1D:
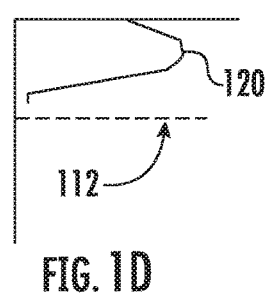
FIG. 1D shows an exemplary species profile.
Figures 3A, 3B:
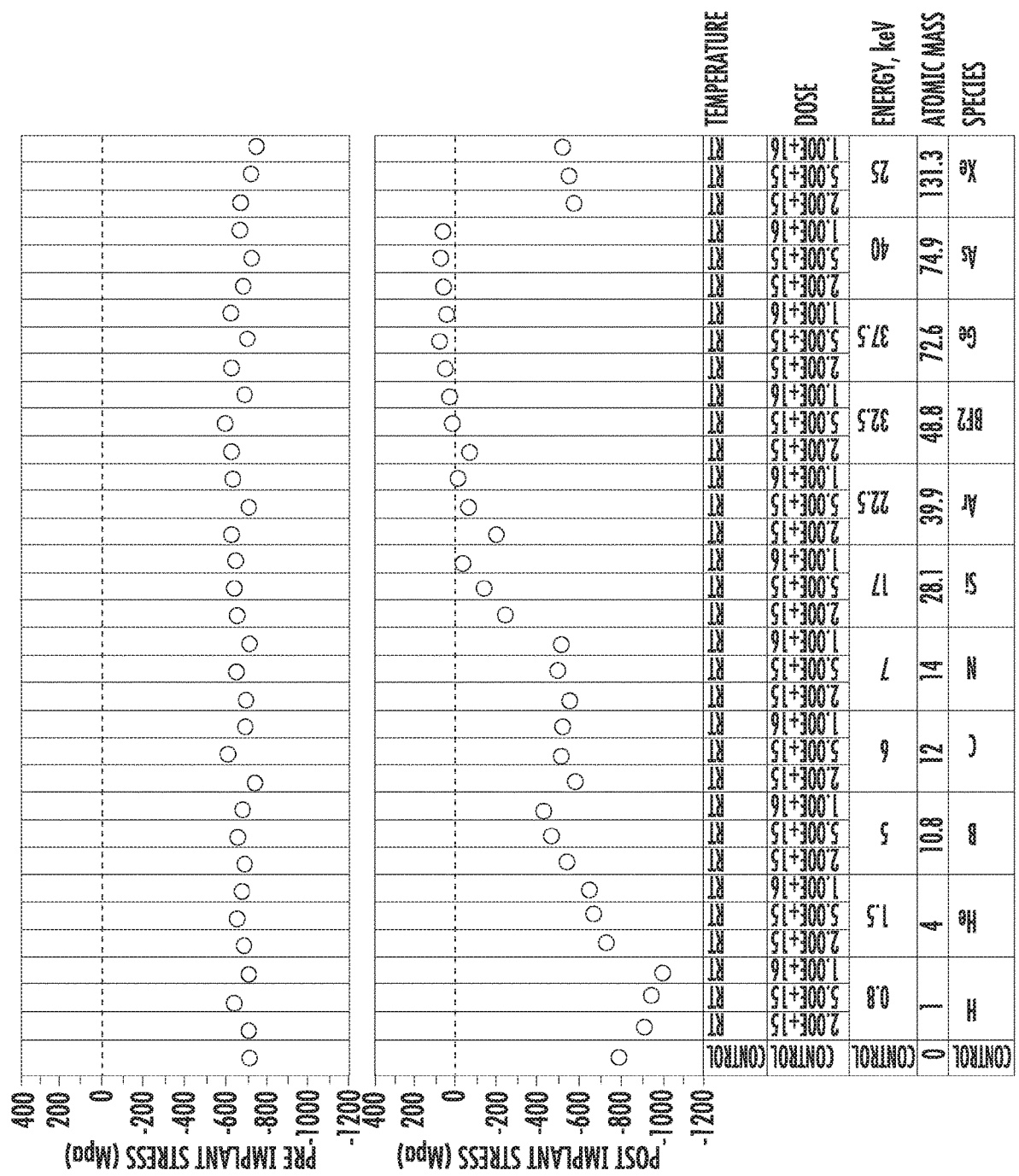
FIG. 3A presents a graph depicting as-deposited stress for a series of SiN layer samples deposited under conditions of medium stress.
FIG. 3B presents stress data for the samples of FIG. 3A after exposure to various ions, according to embodiments of the disclosure.

Turning also to FIG. 1D, there is shown an exemplary species profile, shown as species profile 120. According to various embodiments, a mask layer, such as hardmask layer 104, characterized by a mask thickness, is implanted with a dose of ions to generate the species profile 120, where the species profile is characterized by an implant range, located within the hardmask layer 104. In other words, the implant range may correspond to the peak of an implant profile, where the peak is within the hardmask layer 104. According to some embodiments, the implant range may be determined by known techniques, such as the known $R_P$ simulation parameter, based on simulation or based on depth profiling. In particular embodiments, the implant range may be greater than 33% of the mask thickness and may be less than 66% of the mask thickness. In various embodiments, the implant depth may also be tuned, wherein the implant depth is less than the mask thickness. The implant depth may correspond to a certain depth beyond the implant range. For example, a given implant profile may be characterized by an implant range, RP and a straggle, LS, where the straggle is a longitudinal straggle into the mask layer, perpendicular to the surface of the mask layer. The straggle may represent a fraction of $R_P$, such as 20%, 30%, and so forth. The implant depth in some embodiments may be defined as $R_P+3*LS$. As an example, for an implant range of 25 nm, the straggle may be 7 nm, generating an implant range of 25 nm+3*7 nm, or 46 nm. In various embodiment, a dose of ions may be implanted into a mask layer, such as hardmask layer 104 to an implant depth, where the implant depth is greater than 50% of the mask thickness and less than 100% of the mask thickness. In this manner, as detailed below, the stress of hardmask layer 104 may be reduced or advantageously adjusted, while not affecting features in the substrate 102, lying below the hardmask layer 104.

Because of the relatively greater etch resistance of PVD layers, the ability to reduce stress facilitates use of a PVD layer as hardmask layer 104, and in particular makes feasible the use of thinner hardmask layers, where mask thickness may range between 20 nm and 100 nm in some non-limiting embodiments.

As further shown in FIG. 1B, the implanting of species 110 is performed when the substrate 102 is disposed on a platen 114. The platen 114 may be cooled by a coolant 116, where the coolant 116 circulates through the platen or through a stage (not separately shown) thermally coupled to the platen 114. In various embodiments, the coolant 116 may act to establish a substrate temperature of substrate 102 of room temperature (~28° C.) or below. In some embodiments, the substrate temperature of substrate 102 may be −100° C. the embodiments are not limited in this context.

Table I. presents a listing of exemplary conditions for implanting species into a hardmask layer according to embodiments of the disclosure. In this set of conditions, several different species are shown, as well as exemplary ion dose and ion energy for directing ions into a hardmask layer. Table I also lists calculated values of $R_P$ and $R_P+3*$(longitudinal straggle), where the latter parameter may be deemed to be the implant depth. These calculated values are based upon TRIM simulation of implantation into a PVD SiN layer, having a layer density of 2.9 g/cm$^3$ (TRIM is a Monte Carlo computer program for calculating the interactions of energetic ions with amorphous targets.)

TABLE I

Exemplary Ion Beam Exposure Conditions and Calculated Implant Parameters for Implantation of Select Species

| | Species | Dose 1 [ions/cm2] | Dose 2 [ions/cm2] | Dose 3 [ions/cm2] | Energy [keV] | Rp [nm] | Rp + 3*LS [nm] |
|---|---|---|---|---|---|---|---|
| 1 | H | 2.00E+15 | 5.00E+15 | 1.00E+16 | 0.8 | 11.4 | 43.5 |
| 2 | He | 2.00E+15 | 5.00E+15 | 1.00E+16 | 1.5 | 12.5 | 43.7 |
| 3 | B | 2.00E+15 | 5.00E+15 | 1.00E+16 | 5.0 | 15.9 | 43.2 |
| 4 | C | 2.00E+15 | 5.00E+15 | 1.00E+16 | 6.0 | 16.1 | 43.1 |
| 5 | N | 2.00E+15 | 5.00E+15 | 1.00E+16 | 7.0 | 16.0 | 41.5 |
| 6 | Si | 2.00E+15 | 5.00E+15 | 1.00E+16 | 17.0 | 20.0 | 44.6 |
| 7 | Ar | 2.00E+15 | 5.00E+15 | 1.00E+16 | 22.5 | 21.0 | 43.5 |
| 8 | BF2 | 2.00E+15 | 5.00E+15 | 1.00E+16 | 32.5 | 21.3 | 45.3 |
| 9 | Ge | 2.00E+15 | 5.00E+15 | 1.00E+16 | 37.5 | 23.9 | 44.6 |
| 10 | As | 2.00E+15 | 5.00E+15 | 1.00E+16 | 40.0 | 24.5 | 45.5 |
| 11 | Xe | 2.00E+15 | 5.00E+15 | 1.00E+16 | 25.0 | 15.3 | 26.7 |

In accordance with various embodiments, a series of 50 nm thick SiN layers were deposited on Si wafers using physical vapor deposition, where the film density of the layers was 2.9 g/cm3. The SiN layer samples were formed under three different conditions, to generate three different levels of compressive stress, characteristic of stress levels found in PVD SiN layers.

The SiN layer samples (on Si wafer substrates) were then exposed to ion beams formed from the various species listed in table I. In many examples, the SiN layer samples were held at room temperature. These examples included SiN layer samples deposited with "high stress", "medium stress", and "low stress" levels, as defined below. In select examples, SiN layer samples deposited with medium levels of stress were exposed to ion beams while cooled to −100° C.

FIG. 2A presents a graph depicting as-deposited stress for a series of SiN layer samples deposited under conditions of high stress, where the value of the high stress was nominally 1.5 GigaPascal (GPA). The different samples are shown as a function of ion exposure conditions, where the ion exposure conditions are listed along the X-axis in FIG. 2B. In principle, the stress values shown in FIG. 2A should not vary substantially, since FIG. 2A presents stress of different samples deposited under the same conditions, before any treatment with different ion beams. As shown, the as-deposited stress is approximately −1500 MPa (1.5 GPa) compressive stress, with a sample-to-sample variation on the order of 100 MPa.

In particular, FIG. 2B depicts stress of the SiN layer samples after exposure to ions when the substrate temperature was room temperature. Thus, a given position along the X-axis in FIG. 2A and FIG. 2B depicts the layer stress before and after exposure to ions, respectively. The ion beam conditions for a given pair of data at a given position along the X-axis is listed below that position. Thus, the FIGS. 2A and 2B illustrate for exposure to 17 KeV Si ions at a dose of 2E15/cm$^2$ leads to a change from a first value of −1450 MegaPascal (MPa) (compressive stress), to a second stress value of −200 MPa (compressive stress). Likewise, the FIGS. 2A and 2B illustrate for exposure to 32.5 KeV $BF_2$ ions at a dose of 2E15/cm² leads to a change from a first value of −1500 MegaPascal (MPa) (compressive stress), to a second stress value of −50 MPa (compressive stress).

One feature of FIG. 2A and FIG. 2B is where the atomic mass of ion species increases from left to right. Another feature of FIG. 2B is where decrease in compressive stress scales with increasing mass for many conditions. Notably, within each ion species the ion dose range varies between 2E15/cm² and 1E16/cm². For a given ion species, compressive stress also decreases as a function of ion dose, as shown. A few other notable features shown in FIG. 2B include: 1) exposure to hydrogen ions at 800 eV over the exemplary ion dose range does not change the high level of compressive stress in the SiN layer samples. Further notable features are: 2) for some higher weight ions, a slight tensile stress may be induced after exposure to the ions over the exemplary ion dose range; and 3) for exposure to the highest weight ion in the series of exposures (Xe), the compressive stress is reduced after ion exposure, but substantially less stress reduction takes place as compared to many lower-mass species.

Returning again to Table I, one feature of the matrix of conditions for all the samples shown in FIG. 2B is the boundary condition where the implant range does not exceed the thickness of the SiN layer. In other words, for the 50 nm-thick SiN layers, the implant range for the different conditions varies between 42 nm and 46 nm (save for the Xe sample where the implant range is 27 nm), corresponding to 83% to 91% of the thickness of the 50 nm thick layer, so the implanted species are contained with the SiN layer. Accordingly, the compressive stress within 50 SiN layers is adjusted under the various conditions of FIG. 2B, while not perturbing or implanting into the underlying substrate. Another feature evident in Table I is the differing implant range, $R_P$, for the different ion species. Unexpectedly, for Si, Ar, $BF_2$, Ge, and As, where the compressive stress in substantially eliminated upon exposure to ions, the value of $R_P$ is between 20 nm and 25 nm, or just 40% to ~50% of the film thickness for the SiN layer. In other words, the peak in implanted species and vast majority of implanted species are located well above the interface 112 with the silicon substrate (at a depth of 50 nm) (see, e.g., FIG. 1D), where implanted species would be expected to be effective in relieving stress.

Notably, the implant range for the lighter ions of Table I is 16 nm or less, meaning a depth of less than one third of the thickness of the SiN layer. Likewise, the implant range for 25 keV Xe is 15 nm, 31% of the thickness of the SiN layer.

Analogous to the data of FIGS. 2A-2B, FIG. 3A and FIG. 3B present graphs depicting as-deposited stress, and after-exposure-to-ions stress, respectively, for a series of SiN layer samples deposited under conditions of medium stress, where the value of the medium stress was nominally 750 MPa, before exposure to ions.

Additionally, select medium stress SiN samples were separately exposed to B, C, °Si, $BF_2$, and As ions at 5E15/cm² at room temperature and cold implant temperature, as shown in FIGS. 4A and 4B. The trends in stress change upon exposure to ions is somewhat similar to the stress changes observed for the high stress samples of FIG. 2. Other notable features shown in FIG. 3B include: 1) exposure to hydrogen ions at 800 eV over the exemplary ion dose range increases the level of compressive stress slightly in the SiN layer samples. Another notable feature is 2) for some higher weight ions, a slight tensile stress may be induced after exposure to the ions over the exemplary ion dose range. A further notable features is 3) for exposure to the highest weight ion in the series of exposures (Xe), the compressive stress is reduced after ion exposure, but substantially less stress reduction takes place as compared to many lower-mass species, such as As, Ge, Si, $BF_2$, and Ar. The compressive stress levels in Xe-exposed samples (500-550 MPa) is similar to the compressive stress levels of SiN samples exposed to B, N, or C. Again, the ion energy of the Xe ions generates an implant depth of 27 nm, well less than the implant depth of samples treated with As, Ge, Si, $BF_2$, and Ar ions.

Additionally, FIG. 4B illustrates where, for a given ion dose, implantation at −100° C. ("CRION") is more effective in reducing compressive stress for the different ion species shown. Notably, for the different ion species examined, including B, C, Si, BF2, and As, implantation was more effective in reducing the compressive stress (or shifting the stress from compressive stress to tensile stress) when performed at −100° C. as compared to room temperature. Notably, in view of the results for −100° C. implantation, implantation at other cryogenic temperatures is also contemplated to reduce stress more effectively than implantation at room temperature, such as implantation at −50° C., −150° C., and so forth.

Analogous to the data of FIGS. 2A-2B, 3A-3B, FIG. 5A and FIG. 5B present graphs depicting as-deposited stress, and after-exposure-to-ions stress, respectively, for a series of SiN layer samples deposited under conditions of low stress, where the value of the low stress was nominally 200 MPa (compressive), before exposure to ions.

Figures 5A, 5B:
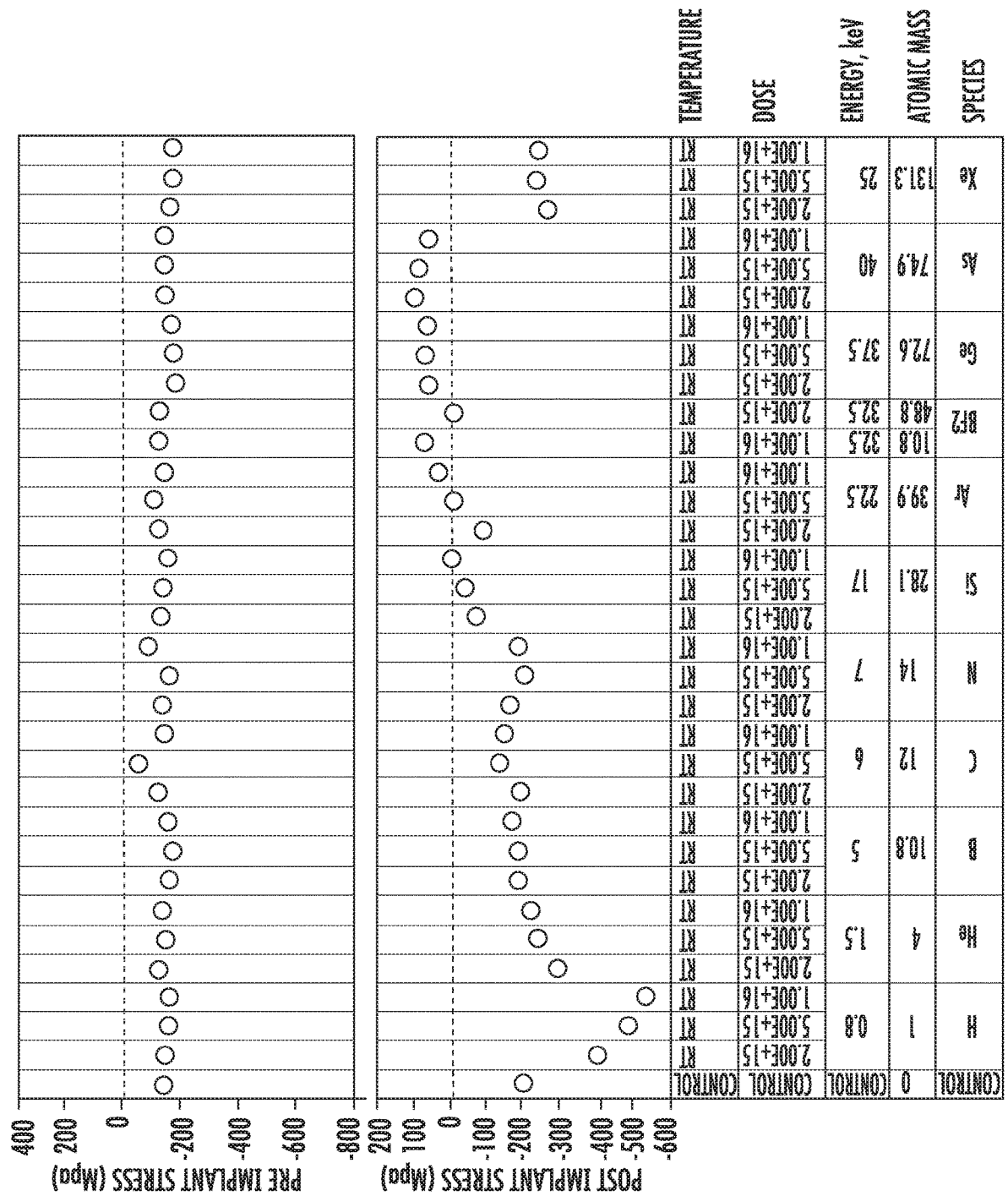
FIG. 5A presents a graph depicting as-deposited stress for a series of SiN layer samples deposited under conditions of low stress.
FIG. 5B presents stress data for the samples of FIG. 4A after exposure to various ions, according to embodiments of the disclosure.

A few notable features shown in FIG. 5B include: 1) exposure to hydrogen ions at 800 eV over the exemplary ion dose range increases the level of compressive stress substantially in the SiN layer samples; and 2) exposure to helium ions increases the level of compressive stress, to a lesser extent than exposure to hydrogen. Other notable features include 3) exposure to Boron, Carbon, and Nitrogen causes little change in the value of compressive stress, over the exemplary ion dose range; and 4) for some higher weight ions, a slight tensile stress may be induced after exposure to the ions over the exemplary ion dose range. A further feature is: 5) for exposure to the highest weight ion in the series of exposures (Xe), the compressive stress is not reduced after ion exposure, but exhibits a slight increase in compressive stress.

Notably, as mentioned above, the implant depth (defined as $R_P+3*LS$, where $R_P$ is the implant range and LS is the longitudinal straggle) for Xe implantation (26.7 nm) was considerably lower than the implantation was implant depth in all other samples (41 nm-45 nm). Moreover, the implant range for Xe (15.3 nm) was comparable to the implant range for B, C, and N samples (15.9 nm-16.1 nm) (31%-32% of the layer thickness for 50 nm-thick layers). Further notably, and with reference to FIGS. 2B, 3B, and 5B, for each of the different initial layer stress values (−1450 MPa, −750 MPa, and −200 MPa), the final stress induced by exposure to Xe ions, is very similar to the final stress induced by exposure to B, C, or N ions for a give ion dose. In comparison, as noted above, the implant range for Si, Ar, $BF_2$, and Ge is considerably deeper, between 20 nm and 24.5 nm (corresponding to 40% to 49% of the thickness of a 50 nm layer), with a concomitantly larger reduction in the compressive stress as compared to implantation with Xe (at 25 kV). Thus, without being bound by any particular theory, the degree of reduction in compressive stress of PVD layers generated by exposure to ions of a given ion species may be related to the implant range of the ion species. Notably, while the above results suggest implantation to an implant range of 30 nm into a 50 nm SiN layer may also be effective in reducing stress in the SiN layer, for the species shown in Table I, the implant depth for an implant range greater than 30 nm exceeds 50 nm. For applications where implantation into a subjacent substrate is to be avoided, such an implant range greater than 30 nm in the SiN layer will be unacceptably deep, due to the straggle causing the implant depth to exceed the SiN layer thickness.

While many of the above results involve 50 nm-thick SiN layers, in other embodiments, the layer thickness may be adjusted, such as within a range of 20 nm to 100 nm. The embodiments are not limited in this context. As such, the ion energy for a given ion species may be adjusted to place the implant range and the implant depth within the SiN layer. For example, the ion energy may be adjusted to place the implant depth within a range of 33% to 66% of the SiN layer thickness, while the implant range does not exceed 99% of the SiN layer thickness.

Advantageously, the present results are achieved using high density PVD layers with density of 2.9 g/cm$^3$, where layer stress may be reduced to levels in the range of 200 MPa compressive to 200 MPa tensile. Such density levels are well above SiN densities of 1.8-2.4 g/cm$^3$ achieved by CVD approaches. While density changes in the SiN layers after implantation was not directly measured, in an analogous set of experiments implanting PVD carbon, layer density after implantation was found to either exceed the layer density before implantation or at worst decrease to approximately 90% of layer density before implantation. Accordingly, the layer density of SiN layers implanted according to the present embodiments may be expected to be comparable to the initial layer density (2.9 g/cm$^3$), somewhat higher than the initial layer density, or no less than 90% of the initial layer density, meaning greater than 2.6 g/cm$^3$.

Figure 6:
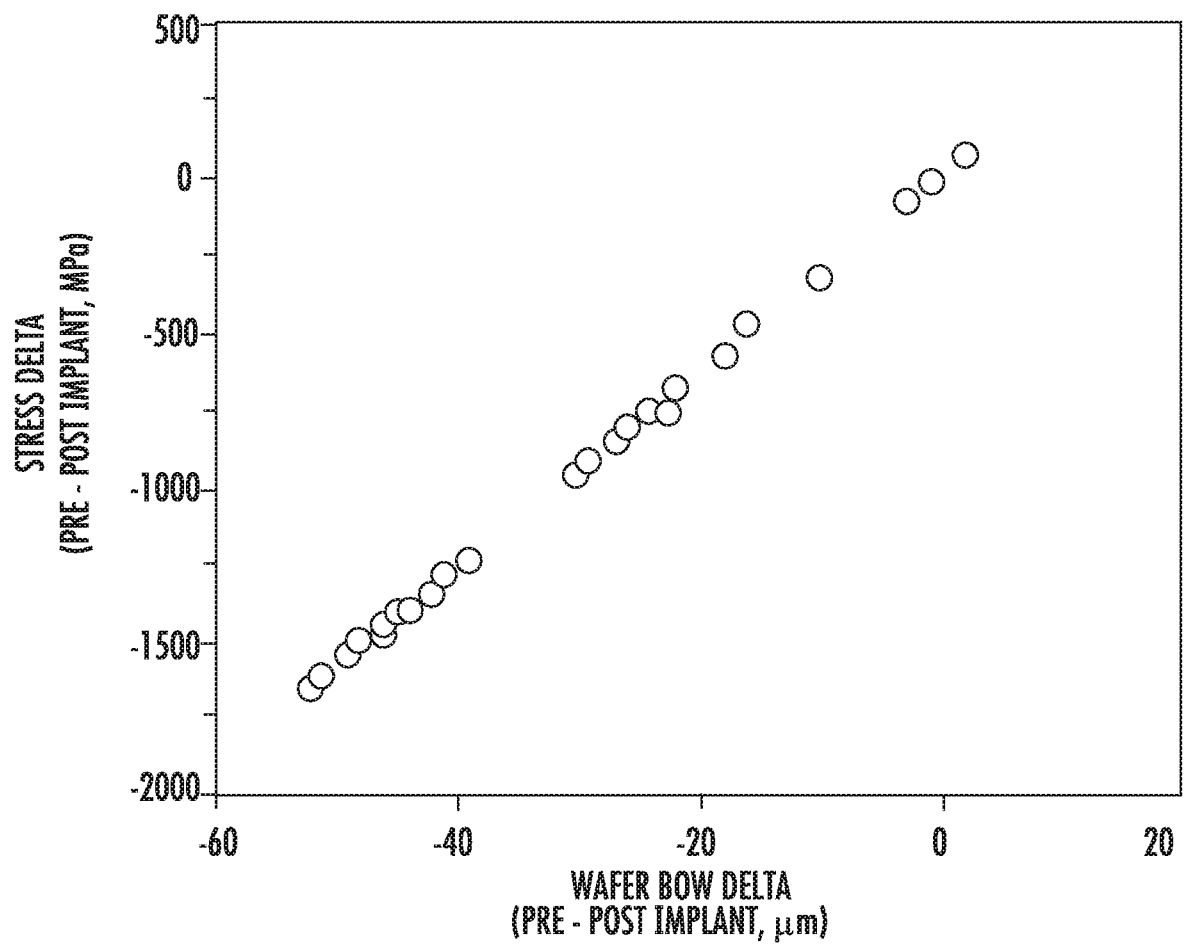
FIG. 6 shows the relation between layer stress in exemplary SiN layers and the wafer bowing in a 300 mm wafer for a series of samples.

FIG. 6 shows how the wafer bow induced by stress of a PVD SiN or other layer may be tuned from −50 μm (convex compressive stress) to +20 μm (concave tensile stress) depending upon the implant condition. The data relates stress change to changes in wafer bow for a 50-nm layer disposed on a 300-mm wafer. The ability to flatten the wafer by imparting the appropriate stress through implantation may be viewed to make subsequent processing easier. For example, tuning to a flat wafer enables wafer clamping with less force and may aid in less of an overlay shift during photolithography stage.

Figure 7:
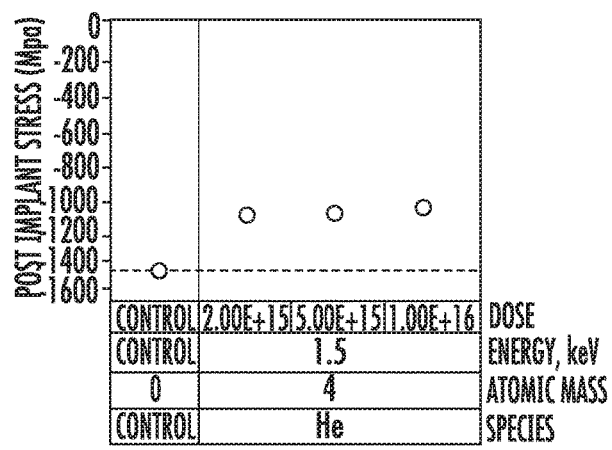
FIGS. 7, 8 and 9 show results for PVD SiN layers after He implantation starting with layers of high, medium, and low stress, respectively.
Figure 8:
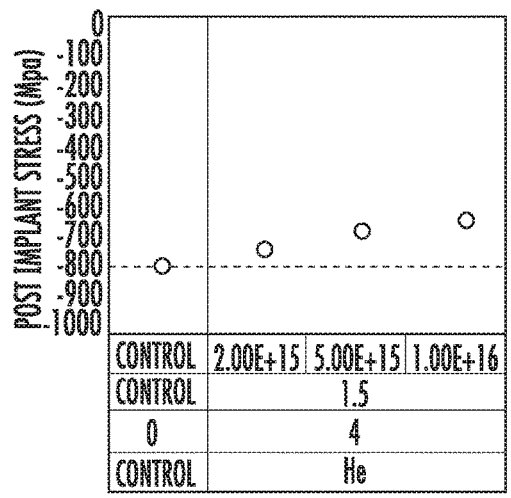
Figure 9:
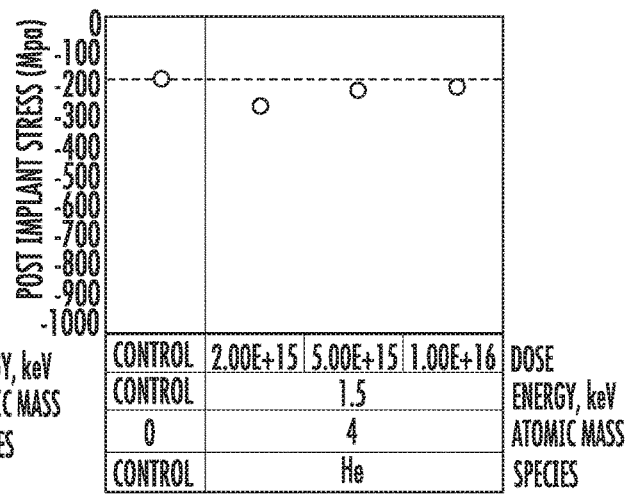
Figure 10:
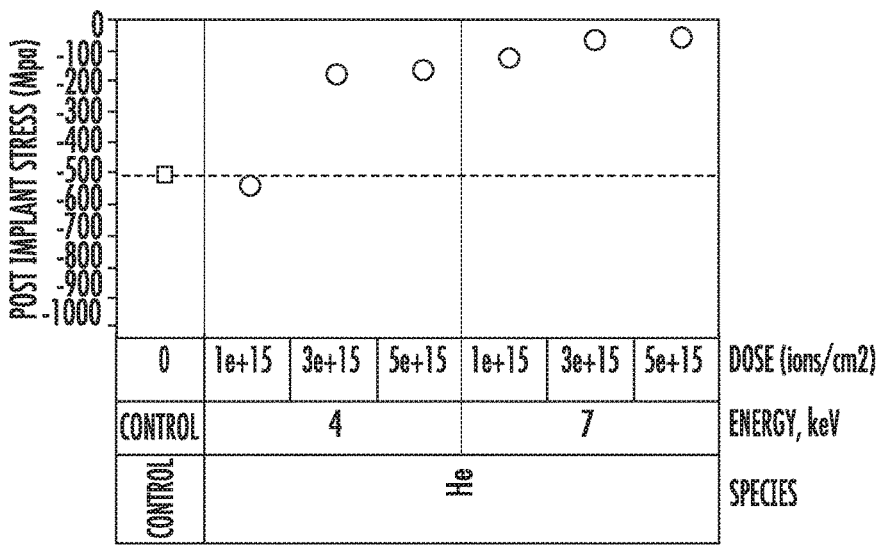
FIG. 10 shows stress data for PVD C after He implants.

FIGS. 7, 8, and 9 show post He implant stress of PVD SiN from a starting layer stress of high, medium and low compressive stress, respectively. FIG. 10 shows the post-He implant stress of a PVD C layer. FIG. 9 shows the low stress (−200 MPa) PVD SiN film becomes slightly more compressive after He implant, while in FIG. 10, the PVD C layer with a starting stress of −500 MPa becomes less compressive after He implant. These results illustrate the direction of the stress change caused by ion implantation may depend on the starting layer material or the level of starting stress, or both of these factors.

Figure 11:
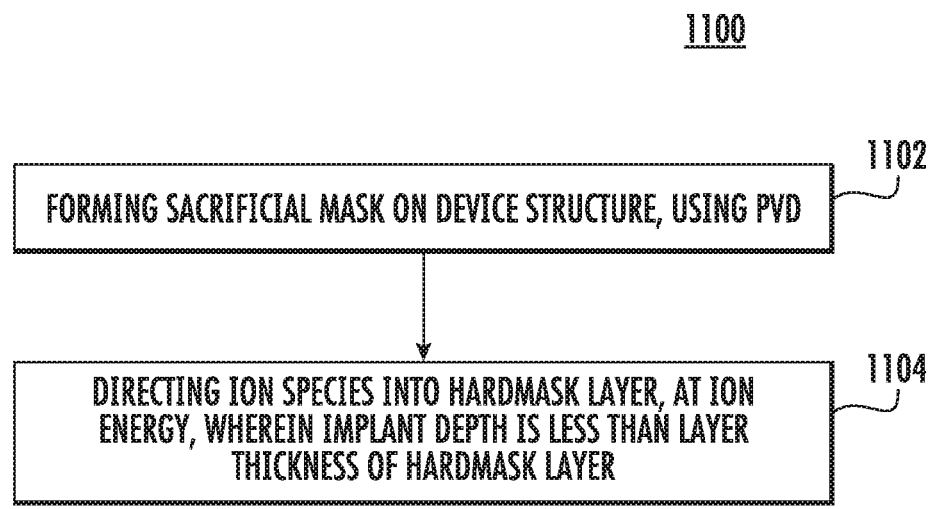
FIG. 11 presents an exemplary process flow.

FIG. 11 presents an exemplary process flow 1100, according to some embodiments of the disclosure. At block 1102, a sacrificial mask is formed on a substrate using physical vapor deposition. The sacrificial mask may be a hardmask material such as SiN in some embodiments. The sacrificial mask may exhibit a compressive stress, such as between 200 MPa and 3 GPa in various embodiments.

At block 1104, ions are directed into the hardmask layer at an ion energy, where, as a result of the ion energy, the implant depth for the ions is less than the thickness of the hardmask layer. According to some embodiments, the implant depth may be defined as $R_P+3*LS$, where Re is the implant range and LS is the longitudinal straggle. In particular embodiments the implant depth may be between 50% and less than 100% of the thickness of the hardmask layer. In some embodiments, the implant range may be between 33% and 66% of the thickness of the hardmask layer, while in particular embodiments, the implant range may be between 40% and 50% of the thickness of the hardmask layer.

In various embodiments, the techniques of modifying stress by employing beamline ion implantation or using PLAD to implant into a layer may be applied to different materials systems, such as PVD/CVD W, PECVD/ALD SiN, a-Si, FCVD SiO$_2$, PVD/CVD/ALD TiN, CVD Co and SiC.

In sum, the present embodiments provide a first advantage of the ability to produce relatively dense layers while exhibiting relatively lower stress using select conditions for implanting a layer after deposition of the layer. The present embodiments further provide the advantage of reducing stress using a relatively lower ion dose in etch resistant hardmask materials, such as PVD SiN layers, by implanting into the substrate at −100° C. The embodiments provide the further advantage of providing a more commercially practical approach to tailoring hardmask properties.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   depositing a mask layer on a substrate using physical vapor deposition, the mask layer having a mask thickness, wherein an absolute value of a stress in the mask layer has a first value; and
   directing a dose of ions into the mask layer, wherein the absolute value of the stress in the mask layer has a second value, less than the first value, after the directing the dose of ions, wherein the directing the dose of ions comprises:
   choosing an ion species and ion energy for the dose of ions,
   wherein the directing the dose of ions causes the ion species to be implanted to an implant range $R_p$, wherein $R_p$ is between 40% and 66% of the mask thickness;
   and causes the ion species to be implanted to an implant depth, the implant depth being given by $R_p+3(LS)$, where LS is longitudinal straggle, and wherein the value of the implant depth is greater than 50% of the mask thickness and less than 100% of the mask thickness.

2. The method of claim 1, wherein the mask layer is a SiN material.

3. The method of claim 1, comprising: implanting the dose of ions at room temperature.

4. The method of claim 1, comprising implanting the dose of ions at less than 0° C.

5. The method of claim 1, comprising implanting the dose of ions at −100° C.

6. The method of claim 2, wherein the first value comprises a level of compressive stress between 200 MPa and 3 GPa.

7. The method of claim 6, wherein the second value comprises a stress value between 200 MPa compressive stress to 200 MPa tensile stress.

8. The method of claim 2, wherein the dose of ions comprises Si ions, Ar ions, $BF_2$ ions, Ge ions, As ions, or Xe ions.

9. The method of claim 2, wherein the dose of ions comprises a dose range of $2E15/cm^2$ to $1E16/cm^2$.

10. The method of claim 1, wherein the implant range is between 40% and 50% of the mask thickness.

11. The method of claim 1, wherein the mask layer comprises a mask thickness of 20 nm to 100 nm.

12. A method for fabricating a low stress layer, comprising:
   depositing a mask layer, comprising SiN, on a substrate using physical vapor deposition, wherein an absolute value of a stress in the mask layer has a first value;
   cooling the substrate to an implantation temperature, the implantation temperature being below room temperature; and
   directing a dose of ions into the mask layer when the substrate is at the implantation temperature, wherein the absolute value of the stress in the mask layer has a second value, less than the first value, after the directing the dose, wherein the directing the dose of ions comprises:
   choosing an ion species and ion energy for the dose of ions,
   wherein the directing the dose of ions causes the ion species to be implanted to an implant range $R_p$, wherein $R_p$ is between 40% and 66% of the mask thickness;
   and causes the ion species to be implanted to an implant depth, the implant depth being given by $R_p+3(LS)$, where LS is longitudinal straggle, and wherein the value of the implant depth is greater than 50% of the mask thickness and less than 100% of the mask thickness.

13. The method of claim 12, wherein the implantation temperature is −100° C.

14. The method of claim 12, wherein the first value corresponds to a compressive stress in a range of 200 MPa to 2 GPa.

15. A method for fabricating a low stress layer, comprising:
   depositing a SiN layer on a substrate using physical vapor deposition, wherein an absolute value of a stress in the SiN layer has a first stress value, and wherein the SiN layer exhibits a first density; and
   directing a dose of ions into the SiN layer, wherein the absolute value of the stress in the mask layer has a second value, less than the first value, and wherein the SiN layer exhibits a second density, at least 90% of the first density, after the directing the dose, wherein the directing the dose of ions comprises:
   choosing an ion species and ion energy for the dose of ions,
   wherein the directing the dose of ions causes the ion species to be implanted to an implant range $R_p$, wherein $R_p$ is between 40% and 66% of the mask thickness;
   and causes the ion species to be implanted to an implant depth, the implant depth being given by $R_p+3(LS)$, where LS is longitudinal straggle, and wherein the value of the implant depth is greater than 50% of the mask thickness and less than 100% of the mask thickness.

16. The method of claim 15, wherein the first stress value corresponds to a compressive stress in a range of 200 MPa to 2 GPa.

17. The method of claim 15, wherein the first density is 2.

* * * * *